US012309995B2

(12) United States Patent
Chiang et al.

(10) Patent No.: US 12,309,995 B2
(45) Date of Patent: May 20, 2025

(54) METHOD OF FORMING SEMICONDUCTOR STRUCTURE

(71) Applicant: NANYA TECHNOLOGY CORPORATION, New Taipei (TW)

(72) Inventors: Chia Che Chiang, New Taipei (TW); Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 415 days.

(21) Appl. No.: 17/818,007

(22) Filed: Aug. 8, 2022

(65) Prior Publication Data

US 2024/0049439 A1 Feb. 8, 2024

(51) Int. Cl.
*H10B 12/00* (2023.01)
(52) U.S. Cl.
CPC .................................. *H10B 12/033* (2023.02)
(58) Field of Classification Search
CPC .............................. H10B 12/033; H01L 28/91
See application file for complete search history.

(56) References Cited

U.S. PATENT DOCUMENTS

2019/0006487 A1* 1/2019 Huang .............. H01L 21/31111

FOREIGN PATENT DOCUMENTS

CN 108538835 A * 9/2018 ......... H01L 27/0805

* cited by examiner

*Primary Examiner* — Edward Chin
(74) *Attorney, Agent, or Firm* — CKC & Partners Co., LLC

(57) ABSTRACT

A method of forming semiconductor structure includes forming a dielectric stack over a substrate. A mask layer is formed over the dielectric stack. A first opening is formed in the mask layer to expose dielectric stack. A second opening is formed in the dielectric stack to expose the substrate, wherein the second opening is communicated with the first opening. A fill layer is formed in the first opening and the second opening. The mask layer and the fill layer are removed such that sidewalls of the dielectric stack are exposed. A capacitor is formed in the second opening of the dielectric stack.

19 Claims, 16 Drawing Sheets

METHOD OF FORMING SEMICONDUCTOR STRUCTURE

BACKGROUND

Technical Field

The present disclosure relates to a method of forming a semiconductor structure.

Description of Related Art

Capacitors are used in a wide variety of semiconductor circuits. For example, the capacitors are used in, for example, DRAM (dynamic random access memory) memory circuits or any other type of memory circuit. DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

SUMMARY

One aspect of the present disclosure is a method of forming semiconductor structure.

According to some embodiments of the present disclosure, a method of forming semiconductor structure includes forming a dielectric stack over a substrate. A mask layer is formed over the dielectric stack. A first opening is formed in the mask layer to expose dielectric stack. A second opening is formed in the dielectric stack to expose the substrate, wherein the second opening is communicated with the first opening. A fill layer is formed in the first opening and the second opening. The mask layer and the fill layer are removed such that sidewalls of the dielectric stack are exposed. A capacitor is formed in the second opening of the dielectric stack.

In some embodiments, forming the fill layer is performed such that the fill layer is in contact with the mask layer and the substrate.

In some embodiments, the mask layer and the fill layer include the same materials.

In some embodiments, removing the mask layer and the fill layer is performed simultaneously by using one etching process.

In some embodiments, the method further includes performing a clean process prior to removing the mask layer and the fill layer.

In some embodiments, forming the dielectric stack includes forming a first sacrificial layer over the substrate. A second sacrificial layer is formed over the first sacrificial layer.

In some embodiments, forming the fill layer is performed such that the fill layer covers sidewalls of the first sacrificial layer and the second sacrificial layer.

In some embodiments, forming the dielectric stack includes forming a first support layer over the substrate. A second support layer is formed over the first sacrificial layer. A third support layer is formed over the second sacrificial layer.

In some embodiments, forming the capacitor in the second opening of the dielectric stack includes forming a bottom electrode layer along the sidewalls of the dielectric stack. A portion of the third support layer is removed to form a first hole exposing the second sacrificial layer. The second sacrificial layer is removed from the first hole. A high-k dielectric layer is formed along a sidewall of the bottom electrode layer. A top electrode layer is removed along a sidewall of the high-k dielectric layer.

In some embodiments, the method further includes forming a semiconductor layer between the first support layer and the second support layer, and between the second support layer and the third support layer.

In some embodiments, forming the capacitor in the second opening of the dielectric stack further includes removing a portion of the second support layer to form a second hole exposing the first sacrificial layer. The first sacrificial layer is removed from the second hole prior to forming the high-k dielectric layer.

In some embodiments, forming the capacitor in the second opening of the dielectric stack further includes removing a horizontal portion of the bottom electrode layer to expose the substrate prior to removing the first sacrificial layer.

Another aspect of the present disclosure is a method of forming semiconductor structure.

According to some embodiments of the present disclosure, a method of forming semiconductor structure includes forming a dielectric stack over a substrate, wherein forming the dielectric stack includes forming a first support layer, a first sacrificial layer, a second support layer, a second sacrificial layer and a third support layer in sequence. A mask layer is formed over the dielectric stack. A first opening is formed in the mask layer to expose the third support layer of the dielectric stack. A second opening is formed in the dielectric stack to expose the substrate, wherein the second opening is communicated with the first opening. A fill layer is formed in the first opening and the second opening, and a native oxide layer is formed over top surfaces of the fill layer and the mask layer. A clean process is performed to remove the native oxide layer. An etching process is performed to remove the mask layer and the fill layer. A capacitor is formed in the second opening of the dielectric stack.

In some embodiments, the etching process is a wet etching process.

In some embodiments, the clean process and the etching process are performed by using different etch solutions.

In some embodiments, the clean process is performed by using an acid etch solution and the etching process is performed by using an alkaline etch solution.

In some embodiments, the first sacrificial layer and the second sacrificial layer remain unchanged while performing the clean process.

In some embodiments, forming the fill layer is performed such that the fill layer is surrounded by the first support layer, the first sacrificial layer, the second support layer, the second sacrificial layer and the third support layer.

In some embodiments, forming the fill layer is performed such that the fill layer extends from substrate to the mask layer.

In some embodiments, the mask layer and the fill layer are polysilicon layers.

In the aforementioned embodiments, since the fill layer is formed in the first opening of the mask layer and the second opening of the dielectric stack, the fill layer can protect the dielectric stack while performing an etching process (i.e., etching process to remove the mask layer) such that the profile of the second opening is not damaged. As such, a profile of the capacitor is not adversely affected and thus the structure of the capacitor can be stable.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
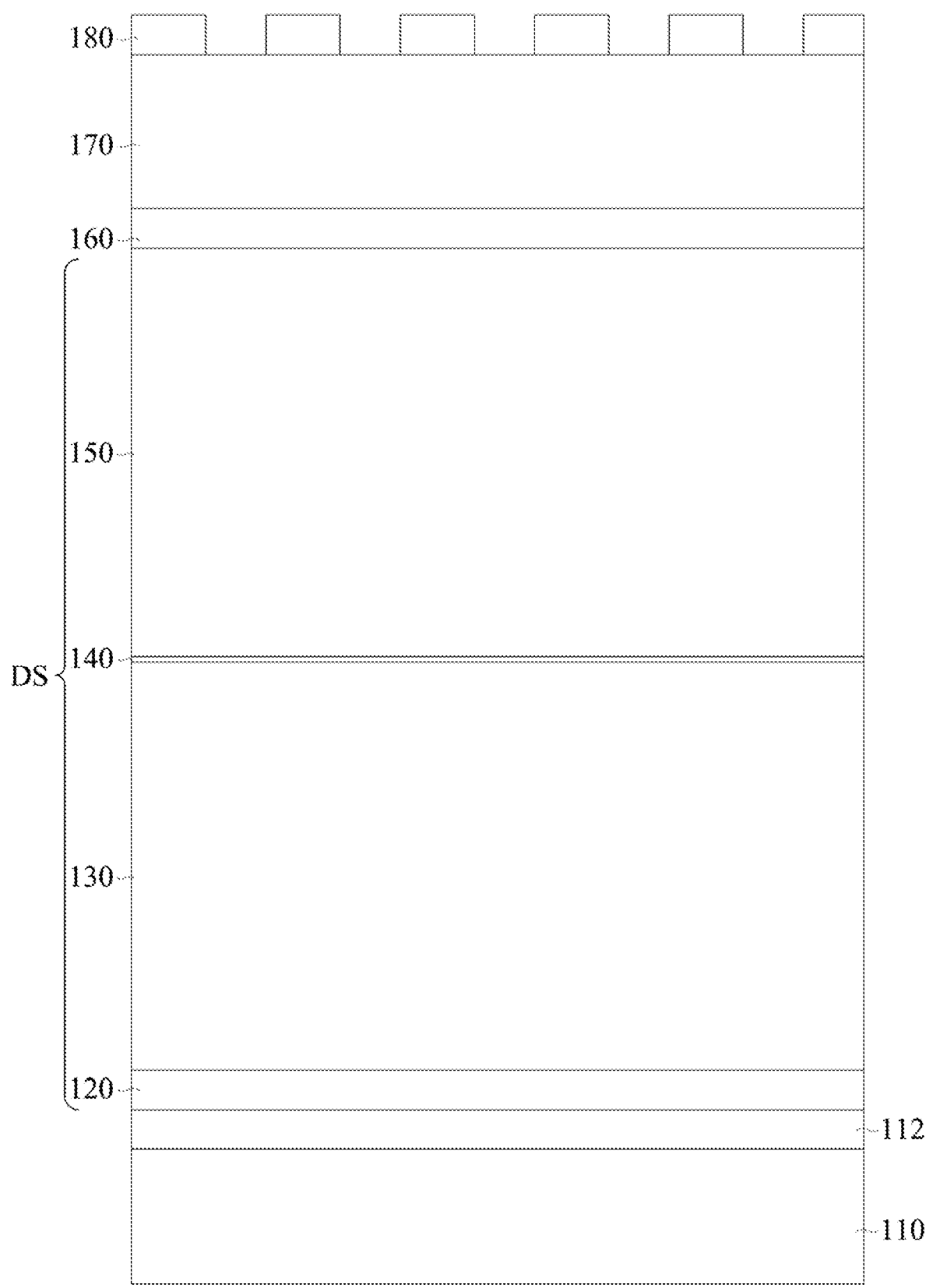
FIGS. 1-15 illustrate cross-section views of intermediate stages of a process of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-15 illustrate cross-section views of intermediate stages of a process of a semiconductor structure in accordance with some embodiments of the present disclosure. Referring to FIG. 1, a dielectric stack DS is formed over a substrate 110. In greater details, forming the dielectric stack DS over the substrate 110 includes forming a first support layer 120 over the substrate 110, forming a first sacrificial layer 130 over the first support layer 120, forming a second support layer 140 over the first sacrificial layer 130, forming a second sacrificial layer 150 over the second support layer 140, and forming a third support layer 160 over the second sacrificial layer 150. In other words, the dielectric stack DS includes the first support layer 120, the first sacrificial layer 130, the second support layer 140, the second sacrificial layer 150 and the third support layer 160 formed in sequence.

In some embodiments, the substrate 110 includes a metal line 112 in contact with the first support layer 120 of the dielectric stack DS. The metal line 112 may include tungsten (W), or other suitable metals. In some embodiments, the substrate 110 further includes an interconnect structure having contacts, transistors or other similar components. As a result, the capacitors (e.g., capacitors Ca in FIGS. 14 and 15) subsequently formed in the dielectric stack DS are connected to other components (e.g., transistors) in the substrate 110.

In some embodiments, the first support layer 120, the second support layer 140 and the third support layer 160 include nitride, such as silicon nitride. In some embodiments, the first sacrificial layer 130 and the second sacrificial layer 150 include oxide. The first sacrificial layer 130 and the second sacrificial layer 150 may be made of different materials. When forming the first sacrificial layer 130, dopants are doped in the first sacrificial layer 130, and the dopants include boron, phosphorus, or combinations thereof. For example, the first sacrificial layer 130 is made of boro-phospho-silicate-glass (BPSG) which is silicon oxide doped with boron and phosphorous. In some embodiments, the second sacrificial layer 150 is made of silane ($SiH_4$) oxide, or other suitable oxide material.

After the dielectric stack DS is formed over the substrate 110, a mask layer 170 is formed over the dielectric stack DS. The mask layer 170 is in contact with the third support layer 160 of the dielectric stack DS. The mask layer 170 is formed such that the third support layer 160 is between the mask layer 170 and the second sacrificial layer 150. In some embodiments, the mask layer 170 includes semiconductor materials, such as polysilicon.

After the mask layer 170 is formed over the dielectric stack DS, a patterned mask 180 is formed over the mask layer 170. The formation of the patterned mask 180 may include forming a mask structure over the mask layer 170, and then patterning the mask structure to expose a portion of the mask layer 170. In some embodiments, the patterned mask 180 and the mask layer 170 includes different materials. The patterned mask 180 may include oxide, such as tetraethoxysilane (TEOS), while the mask layer 170 includes polysilicon.

Figure 2:
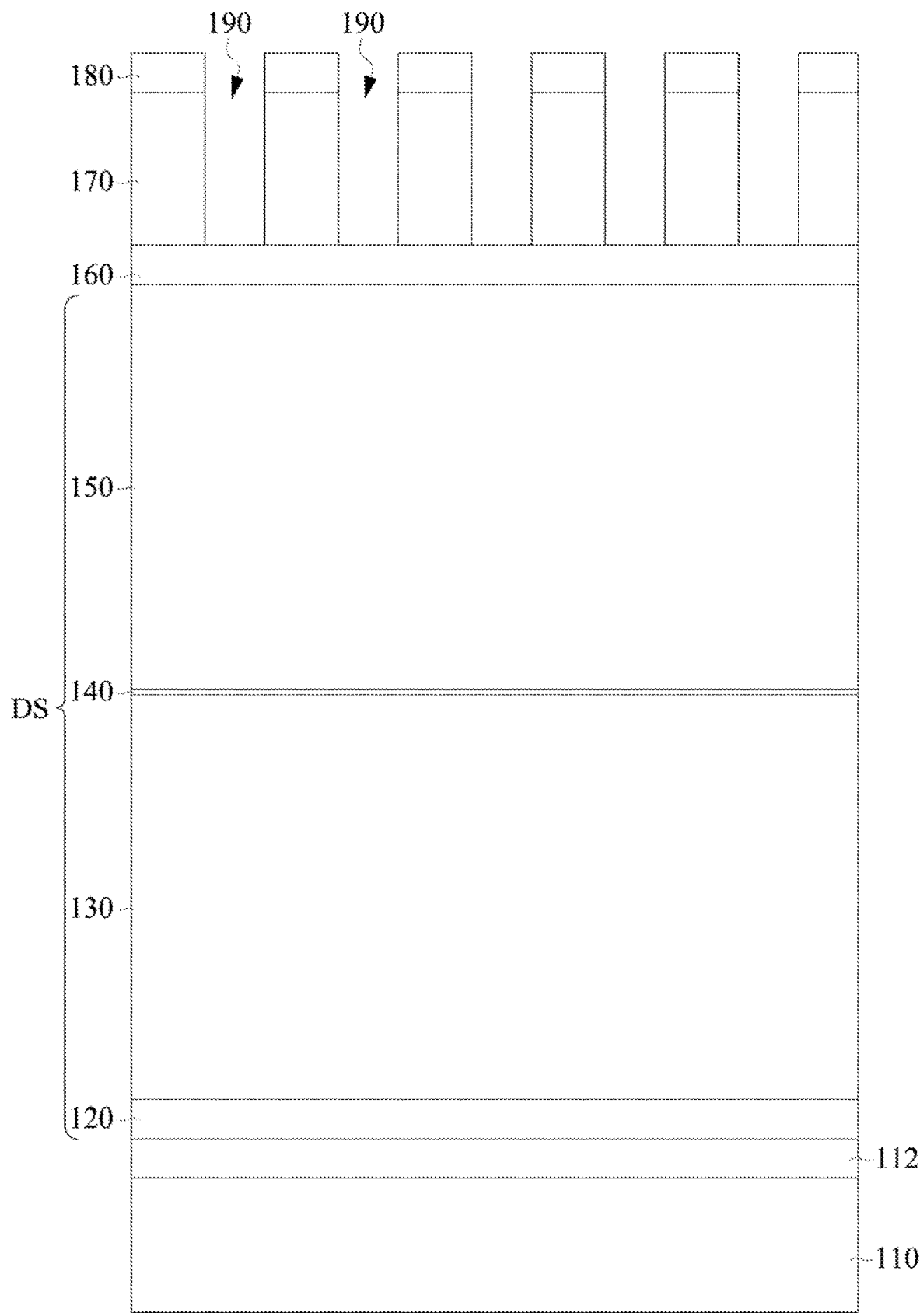

Referring to FIG. 2, first openings 190 are formed in the mask layer 170 to expose the third support layer 160 of the dielectric stack DS. The mask layer 170 is etched using the patterned mask 180 as an etch mask. In some embodiments, etching the mask layer 170 to form the first openings 190 is performed by a dry etching process.

Figure 3:
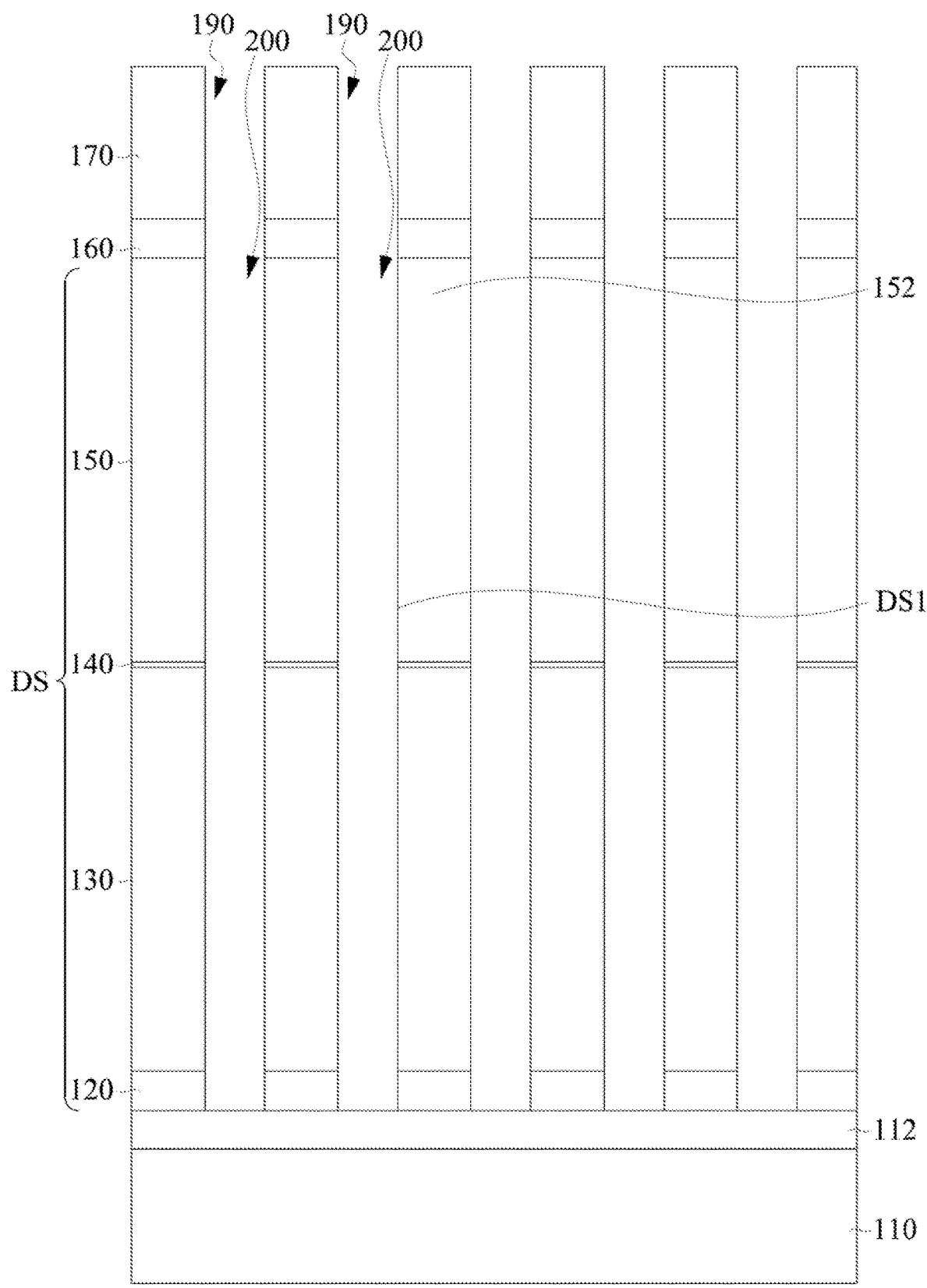

Referring to FIG. 2 and FIG. 3, after forming the first openings 190, second openings 200 are formed in the dielectric stack DS to expose the substrate 110, in which each of the second openings 200 is communicated with (e.g., fluidly communicated with) the respective first openings 190. In other words, the dielectric stack DS is etched along the first openings 190 to form the second openings 200 in the dielectric stack DS. The second openings 200 may expose sidewalls DS1 of the dielectric stack DS. In some embodiments, etching the dielectric stack DS to form the second openings 200 is performed by a dry etching process. For example, a dry etchant, such as hydrogen ($H_2$) and nitrogen ($N_2$), may be selected for the dry etching process. In some embodiments, a top portion 152 of the second sacrificial layer 150 of the dielectric stack DS closest to the third support layer 160 has a minimum width because of performing the etching process to form the second openings 200. In other words, each of the second openings 200 has a portion having a maximum width adjacent to the top portion 152 of the second sacrificial layer 150. In some embodiments, the patterned mask 180 is removed prior to forming the second openings 200.

Figure 4:
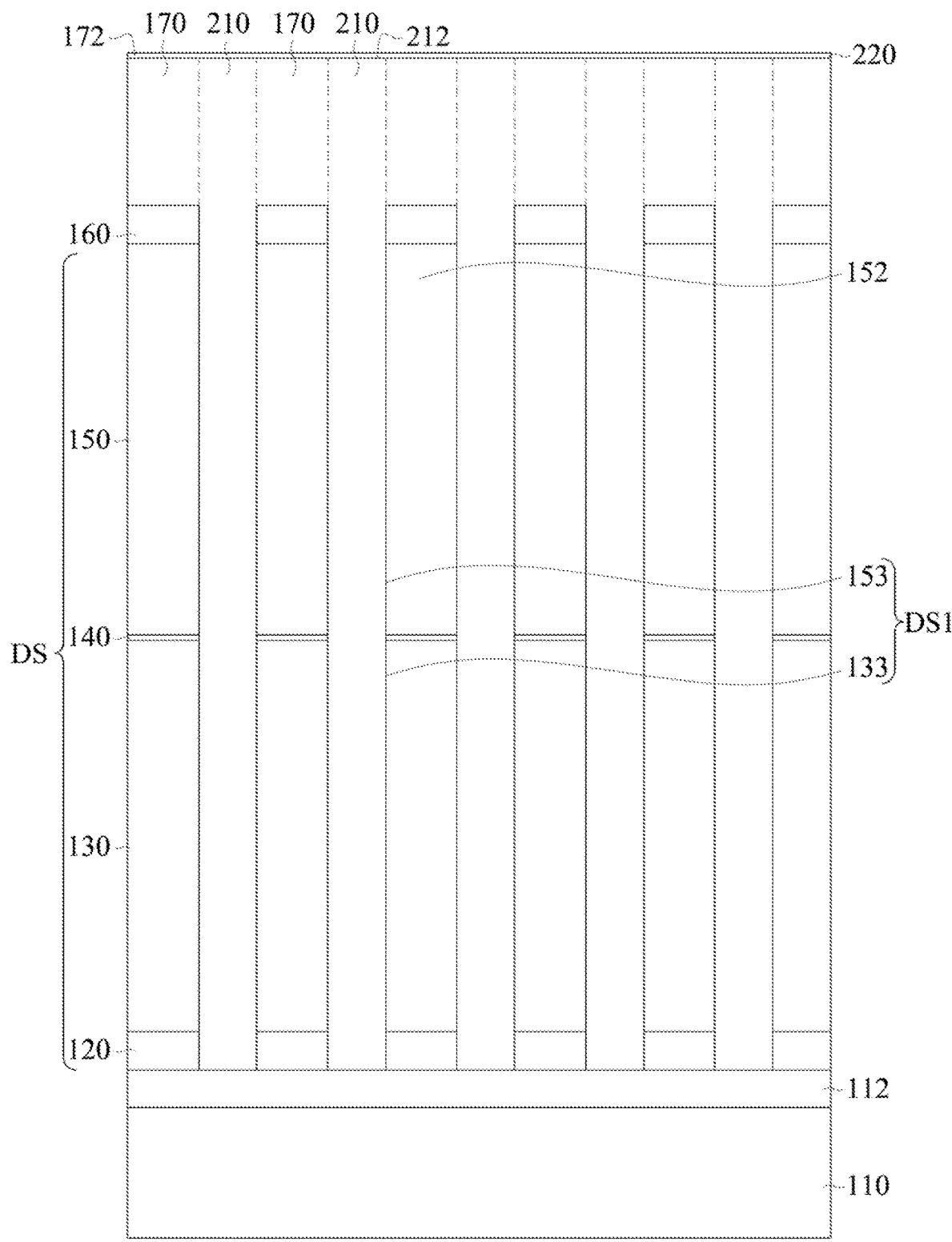

Referring to FIG. 3 and FIG. 4, after forming the second openings 200 in the dielectric stack DS, a fill layer 210 is formed in the first openings 190 and the second openings 200, and a native oxide layer 220 is formed over a top surface 212 of the fill layer 210 and a top surface 172 of the mask layer 170. The native oxide layer 220 is formed on the top surface 212 (i.e., exposed surface) of the fill layer 210 when the fill layer 210 is exposed to air under ambient conditions. Similarly, the native oxide layer 220 is further formed over the top surface 172 (i.e., exposed surface) of the mask layer 170 when the mask layer 170 is exposed to air under ambient conditions. As such, the native oxide layer 220 is formed over both of the top surface 172 of the mask layer 170 and the top surface 212 of the fill layer 210. In some embodiments, the native oxide layer 220 is a thin film and made of silicon dioxide ($SiO_2$).

In some embodiments, the fill layer 210 is in contact with the mask layer 170, the dielectric stack DS and the substrate. Specifically, the fill layer 210 is in contact with a sidewall of the mask layer 170, the metal line 112 of the substrate 110. The fill layer 210 may extend from the metal line 112 of the substrate 110 to the mask layer 170. In some embodiments, the fill layer 210 is surrounded by and in contact with the first support layer 120, the first sacrificial layer 130, the second support layer 140, the second sacrificial layer 150 and the third support layer 160 of the dielectric stack DS. Since the fill layer 210 covers sidewalls 133 of the first sacrificial layer 130 and sidewalls 153 of the second sacrificial layer 150, the fill layer 210 can prevent the first sacrificial layer 130 and the second sacrificial layer 150 from being damaged during subsequent etching process (e.g., clean process 230 in FIG. 5 and etching process 240 in FIG. 6). In some embodiments, the fill layer 210 has a material the same as that of the mask layer 170 to have high filing ratio into the second openings 200 of the dielectric stack DS. The fill layer 210 and the mask layer 170 may include polysilicon, semiconductor materials, or other suitable materials. For example, since the fill layer 210 and the mask layer 170 are polysilicon layers, there is no interface between the fill layer 210 and the mask layer 170.

Figure 5:
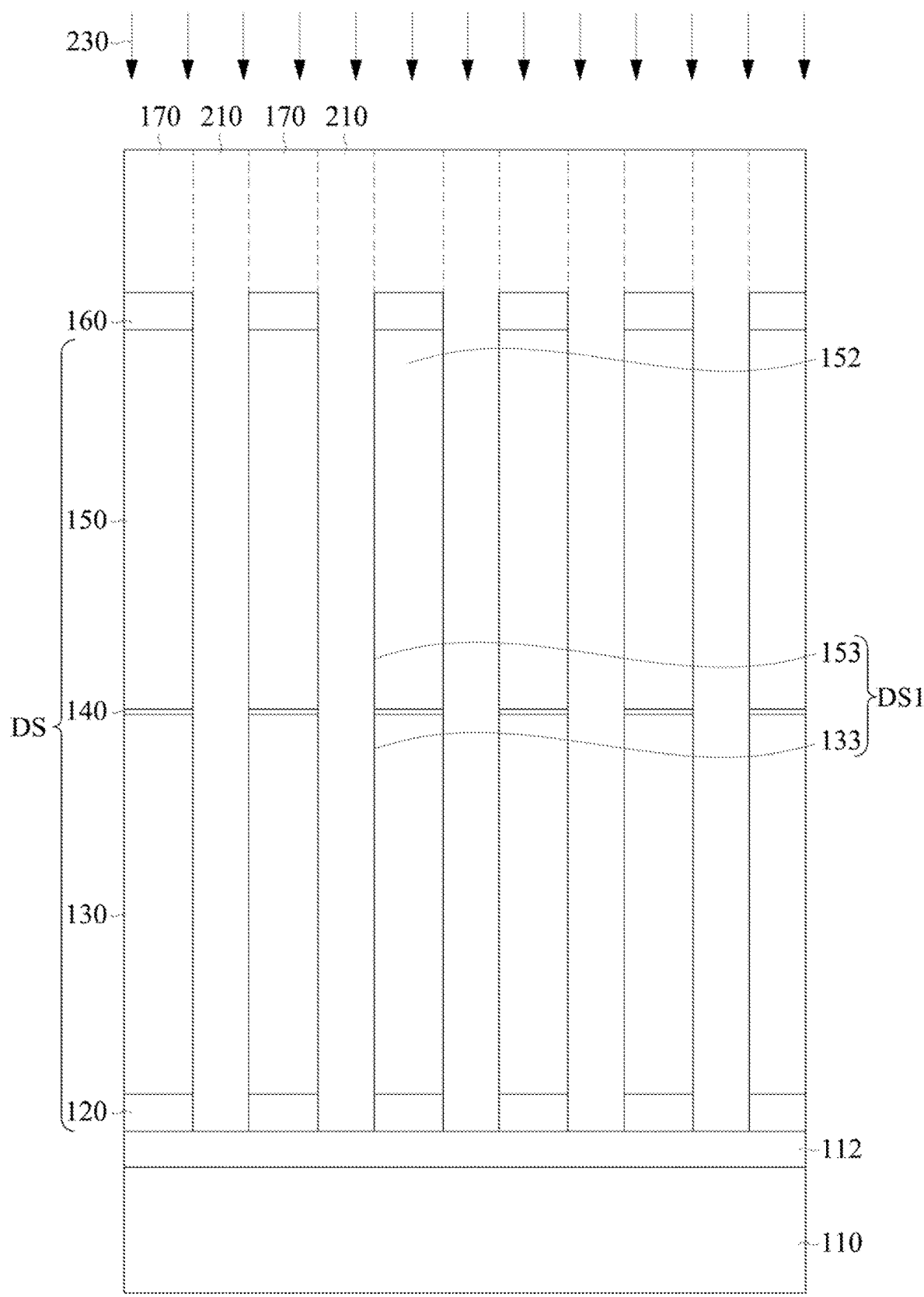

Referring to FIG. 4 and FIG. 5, a clean process 230 is performed to remove the native oxide layer 220 such that the fill layer 210 and the mask layer 170 are exposed. Since the first sacrificial layer 130 and the second sacrificial layer 150 are covered by the fill layer 210, the first sacrificial layer 130 and the second sacrificial layer 150 remain unchanged while performing the clean process 230. If the fill layer 210 does not cover the sidewalls 133 of the first sacrificial layer 130 and the sidewalls 135 of the second sacrificial layer 150, the first sacrificial layer 130 and the second sacrificial layer 150 would be damaged during the clean process 230, thereby adversely affect performance of a capacitor (e.g., capacitors Ca in FIG. 15) formed in the dielectric stack DS.

In some embodiments, the clean process 230 is performed by using an acid etch solution. For example, the acid etch solution of the clean process 230 includes fluoride-based solution, such as hydrogen fluoride (HF). The chemical reaction is performed by reacting native oxide layer 220 (e.g., $SiO_2$) and the fluoride-based ($F^-$) solution to remove the native oxide layer 220. The chemical reaction is shown by chemical equation (I).

$$SiO_2 + F^- \rightarrow SiF_6^{2-} \quad \text{(I)}$$

Figure 6:
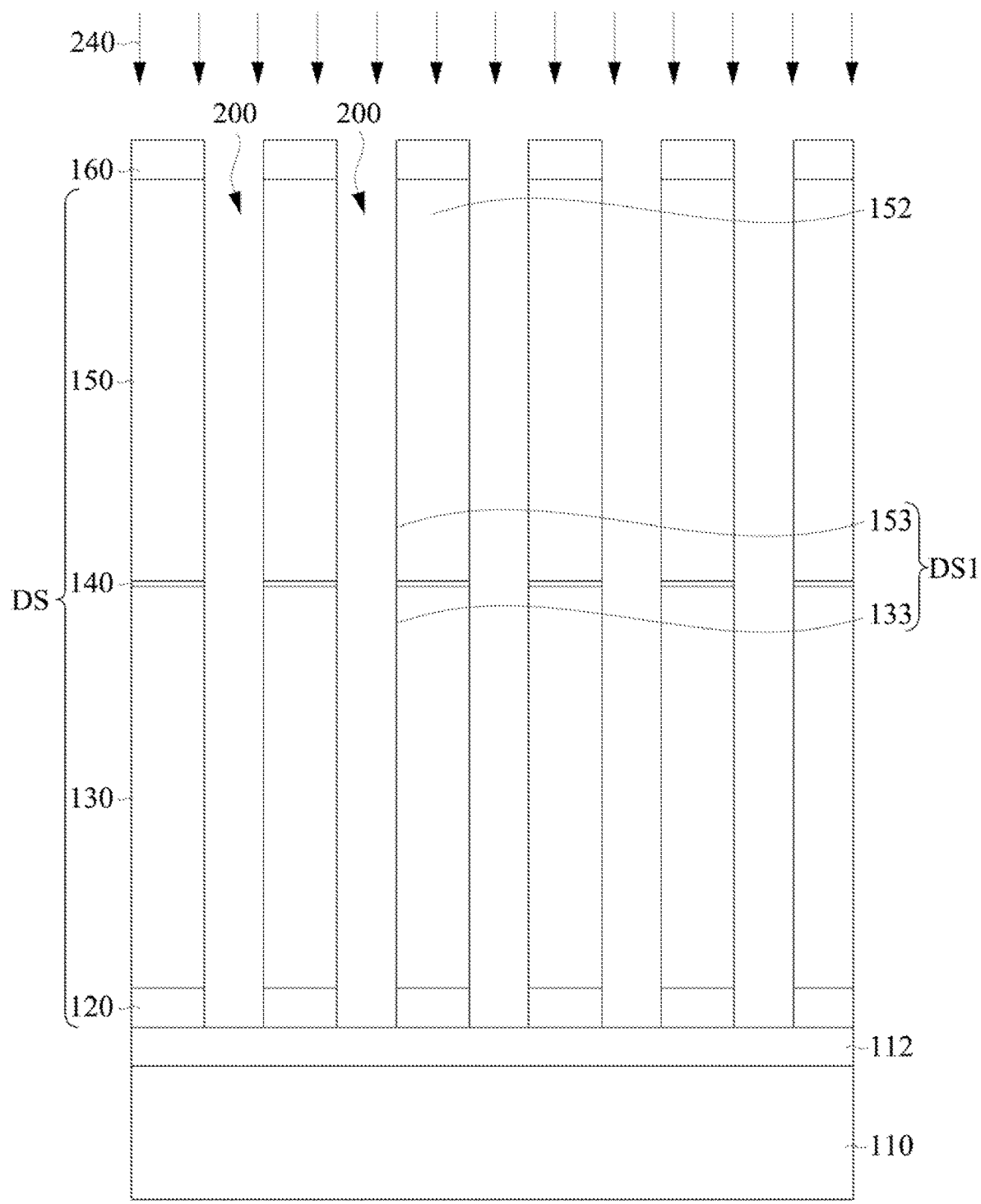
Figure 7:
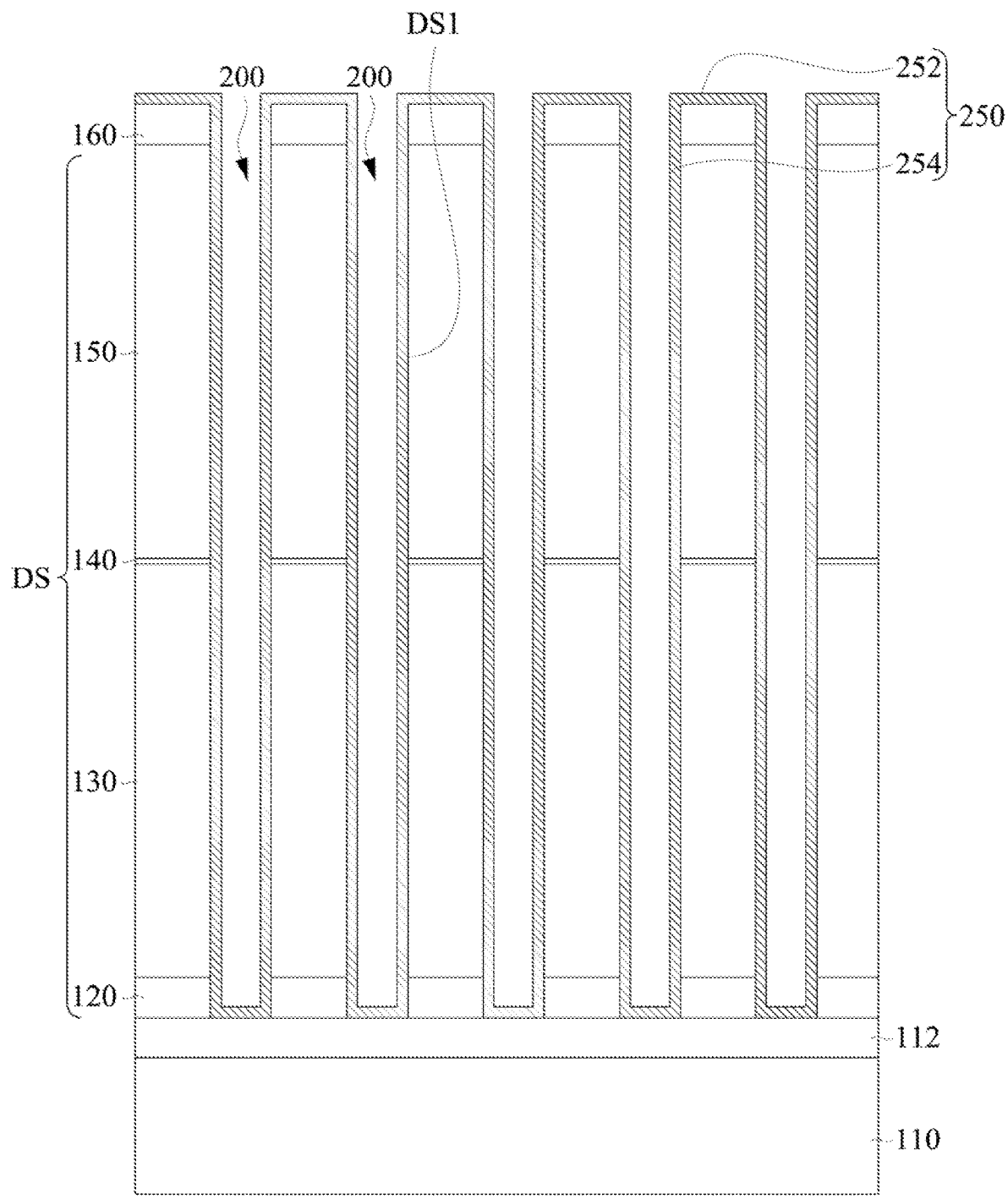

Referring to FIG. 5 and FIG. 6, an etching process 240 is performed to remove the mask layer 170 and the fill layer 210 such that the sidewalls DS1 (i.e., sidewalls of the first support layer, the sidewalls 133 of the first sacrificial layer 130, sidewalls of the second support layer 140, the sidewalls 153 of the second sacrificial layer 150 and sidewalls of the third support layer 160) are exposed. Further, the etching process 240 is performed to remove the mask layer 170 and the fill layer 210 such that the second openings 200 of dielectric stack DS is formed again. The metal line 112 of the substrate 110 is exposed through the second openings 200.

In some embodiments, removing the mask layer 170 and the fill layer 210 is performed simultaneously by using one etching process. Since the mask layer 170 and the fill layer 210 includes the same materials (e.g., polysilicon), the mask layer 170 and the fill layer 210 can be removed simultaneously during the etching process 240. In some embodiments, the etching process 240 may include, for example, an anisotropic etching process using an etch solution has etch selectivity for etching the mask layer 170 and the fill layer 210 while substantially not etching the dielectric stack DS. Stated another way, the etch solution of the etching process 240 has a higher selectivity etch rate at the mask layer 170 and the fill layer 210, which results in etch amounts of the support layers (i.e., the first support layer 120, the second support layer 140 and the third support layer 160) and the sacrificial layers (i.e., the first sacrificial layer 130 and the second sacrificial layer 150) close to zero. With above-mentioned method (e.g., forming the fill layer 210 and then performing the clean process 230 and the etching process 240), the first sacrificial layer 130 and the second sacrificial layer 150 would not be excessively damaged and thus the profile of the second openings 200 of the dielectric stack DS is not excessively expanded. As such, a profile of the capacitor formed in subsequent process is not adversely affected and the structure of the capacitor can be stable (e.g., prevent short circuits in the capacitor). Further, a width critical dimension (i.e., a maximum width of the dielectric stack DS near the top portion 152 of the second sacrificial layer 150 minus a width downward about 100 nanometers from the maximum width) of the second openings 200 of the dielectric stack DS can be decreased, in which the width critical dimension of the second openings 200 is in a range of about 1.5 nanometers to about 2 nanometers. If the fill layer 210 is not formed in the dielectric stack DS prior to performing the clean process 230 and the etching process 240, the width critical dimension of the second openings 200 would be in a range of about 4 nanometers to about 5 nanometers, thereby adversely affecting the profile of the capacitor formed in subsequent process.

In some embodiments, the clean process 230 and the etching process 240 are performed by using wet etching processes. The clean process 230 and the etching process 240 may be performed by using different etch solutions. For example, the clean process 230 is performed by using an acid etch solution and the etching process 240 is performed by using an alkaline etch solution. In some embodiments, the etch solution of the etching process 240 includes hydroxides-based solution, such as including ammonium hydroxide ($NH_4OH$). The chemical reaction is performed by reacting the mask layer 170 and the fill layer 210 (e.g., Si) and the hydroxides-based ($OH^-$) solution to remove the mask layer 170 and the fill layer 210. The chemical reaction is shown by chemical equation (II).

$$Si + OH^- \rightarrow SiO_3^{2-} + H_2 \quad \text{(II)}$$

Referring to FIGS. 7-15, capacitors Ca are formed in the second openings 200 of the dielectric stack DS. Discussed in greater details, referring to FIG. 7, bottom electrode layers 250 are formed in the second openings 200 of the dielectric stack DS. The bottom electrode layers 250 may include horizontal portions 252 and vertical portions 254 connected to the horizontal portions 252, in which the horizontal portions 252 are in contact with a top surface of the dielectric stack DS and the metal line 112 of the substrate 110 and the vertical portions 254 are along the sidewalls DS1 of the dielectric stack DS. In some embodiments, the bottom electrode layers 250 include titanium nitride (TiN) or other suitable conductive materials.

Figure 8:
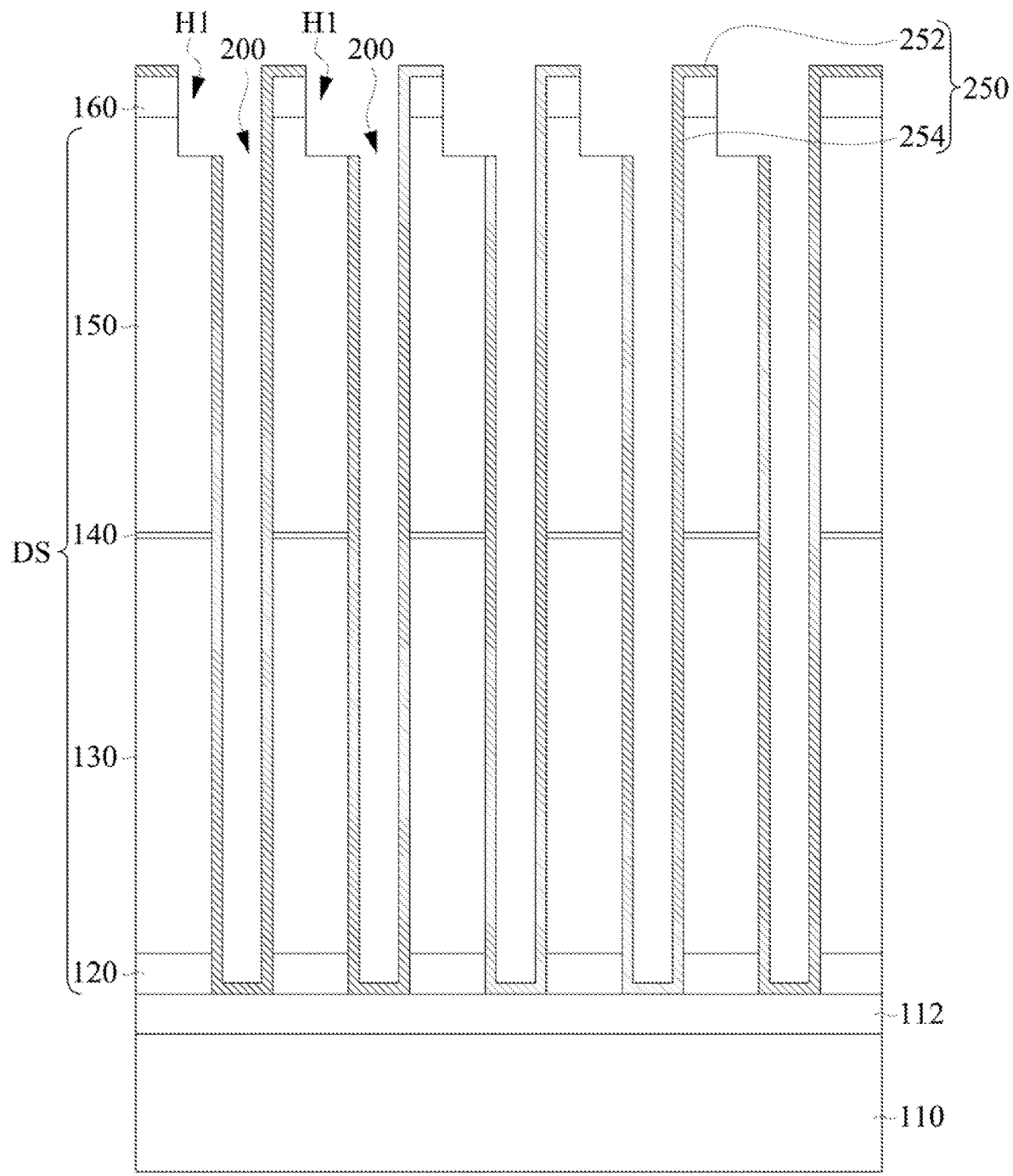

Referring to FIG. 8, a portion of the third support layer 160 is removed to form a first hole H1 exposing the second sacrificial layer 150. In some embodiments, a portion of the bottom electrode layer 250 and a portion of the second sacrificial layer 150 are removed. As such, the second sacrificial layer 150 has a stepped profile (i.e., an exposed top surface and an exposed sidewall perpendicular to the exposed top surface). In some embodiments, removing the portion of the third support layer 160 to form the first hole H1 is performed by a dry etching process.

Figure 9:
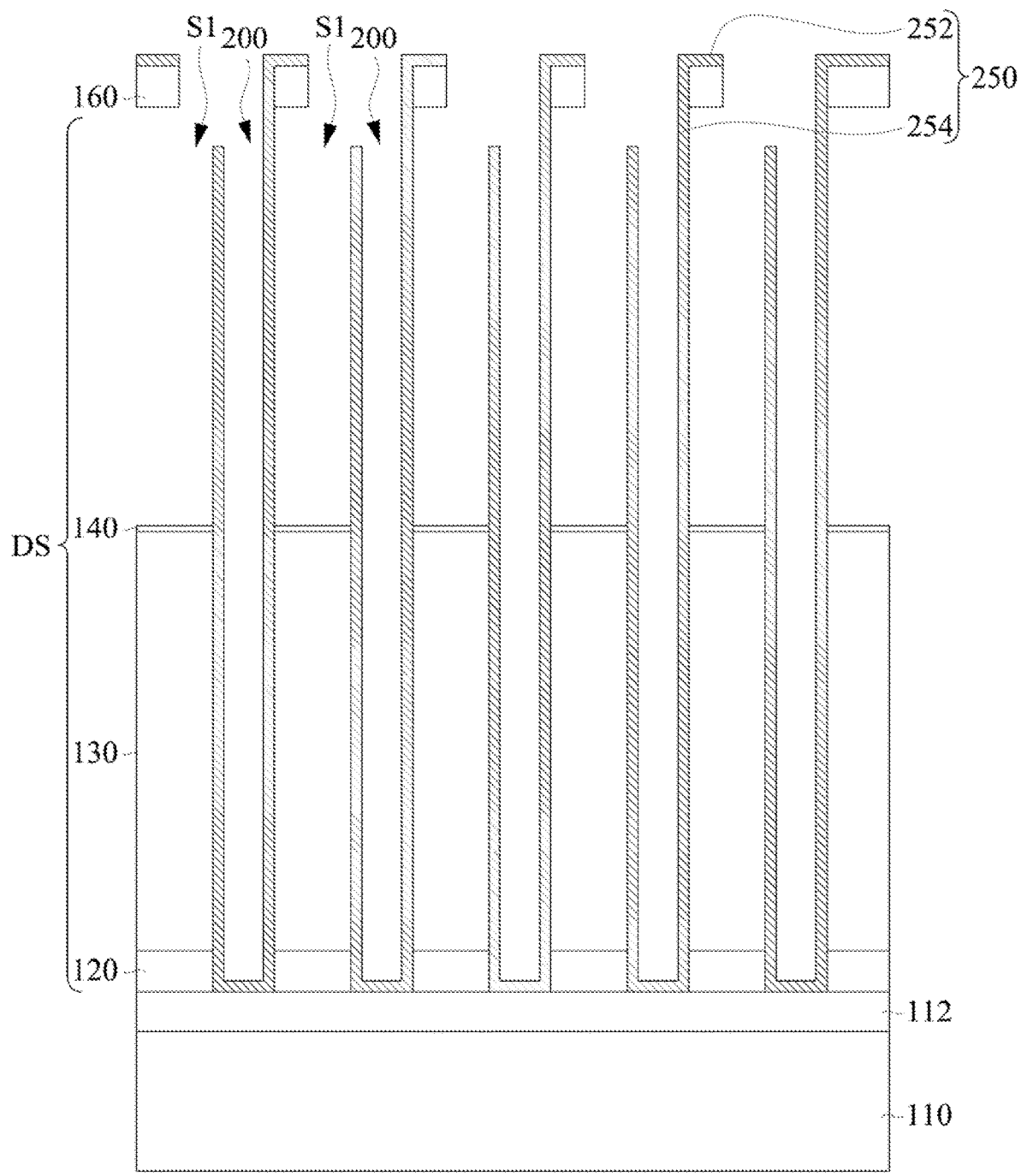

Referring to FIG. 8 and FIG. 9, the second sacrificial layer 150 of the dielectric stack DS is removed from the first hole H1. In some embodiments, an etching process is performed to remove the second sacrificial layer 150. For example, the second sacrificial layer 150 is removed by using a wet etching process, and an etch solution thereof includes fluoride-based solution, such as hydrogen fluoride (HF). After removing the second sacrificial layer 150, spaces S1 are formed between the second support layer 140 and the third support layer 160.

Figure 10:
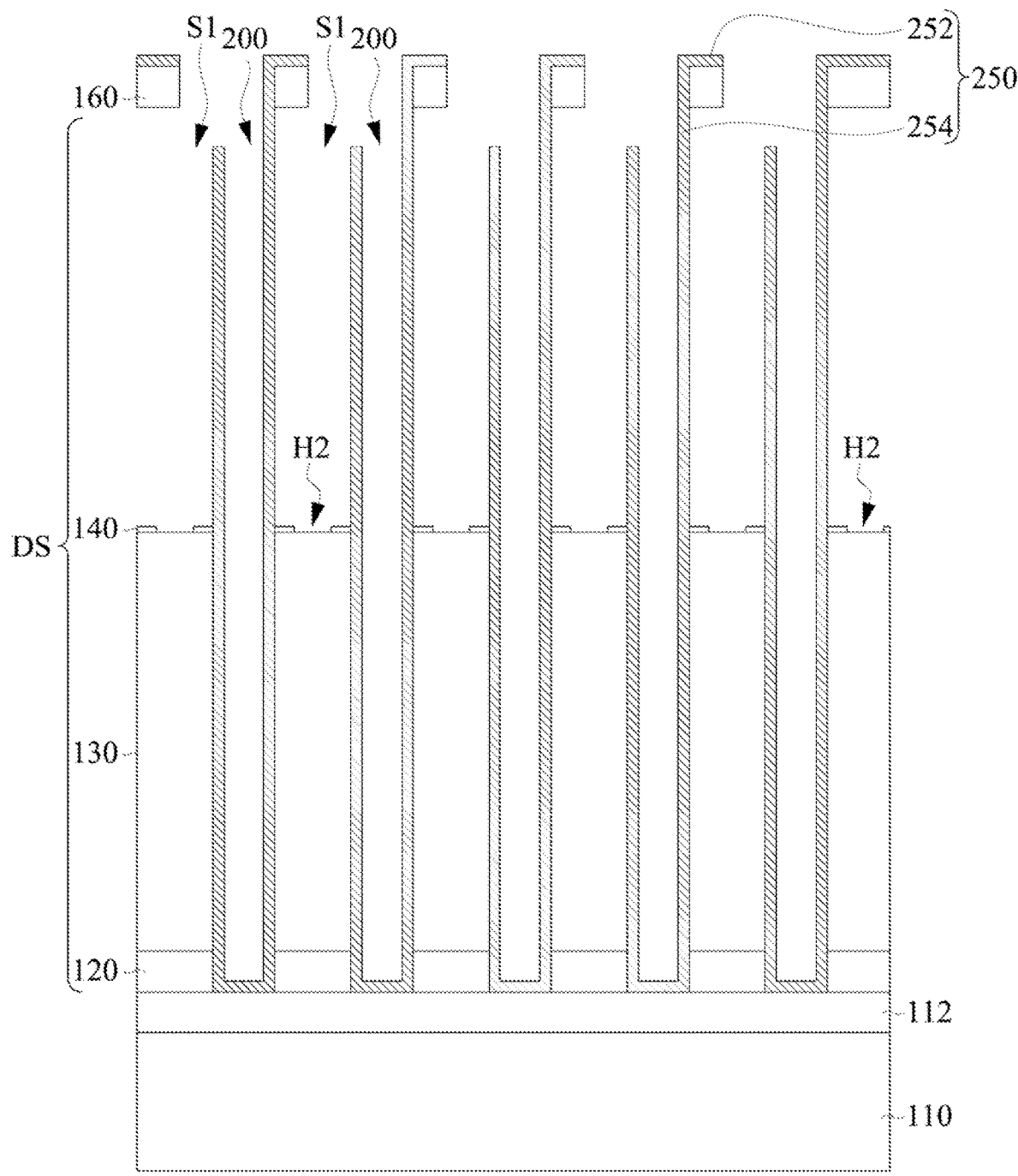
Figure 11:
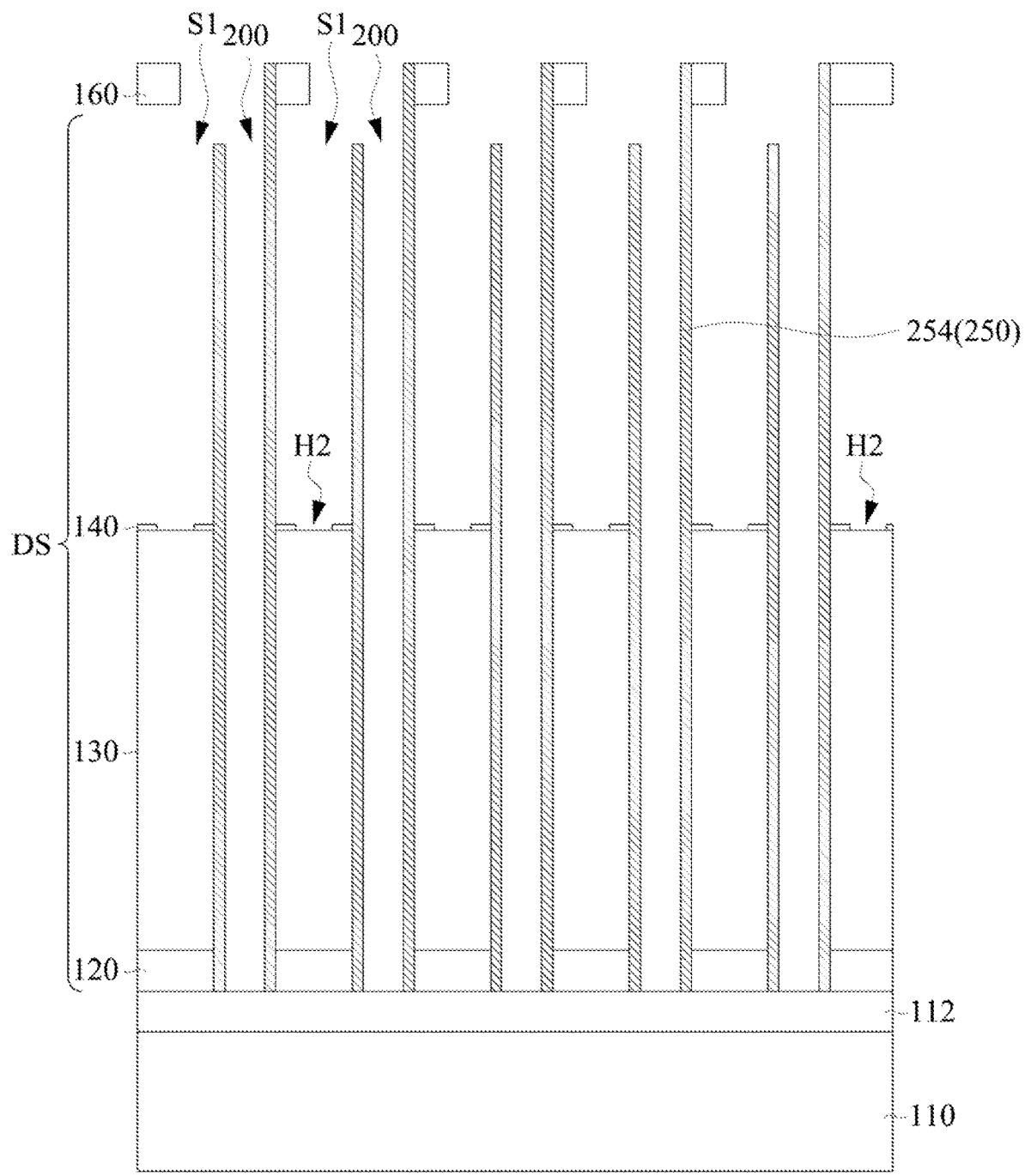

Referring to FIG. 10, a second hole H2 is formed in the second support layer 140 to expose a portion of the first sacrificial layer 130. In some embodiments, etching the second support layer 140 to form the second hole H2 is performed by a dry etching process. Referring to FIG. 10 and FIG. 11, after forming the second hole H2 in the second support layer 140, the horizontal portions 252 of the bottom electrode layers 250 are removed, while leaving the vertical portions 254 of the bottom electrode layers 250 remained. As such, the top surface of the third support layer 160 and the metal line 112 of the substrate 110 are exposed. In some embodiments, etching the horizontal portions 252 of the bottom electrode layers 250 is performed by a dry etching process.

Figure 12:
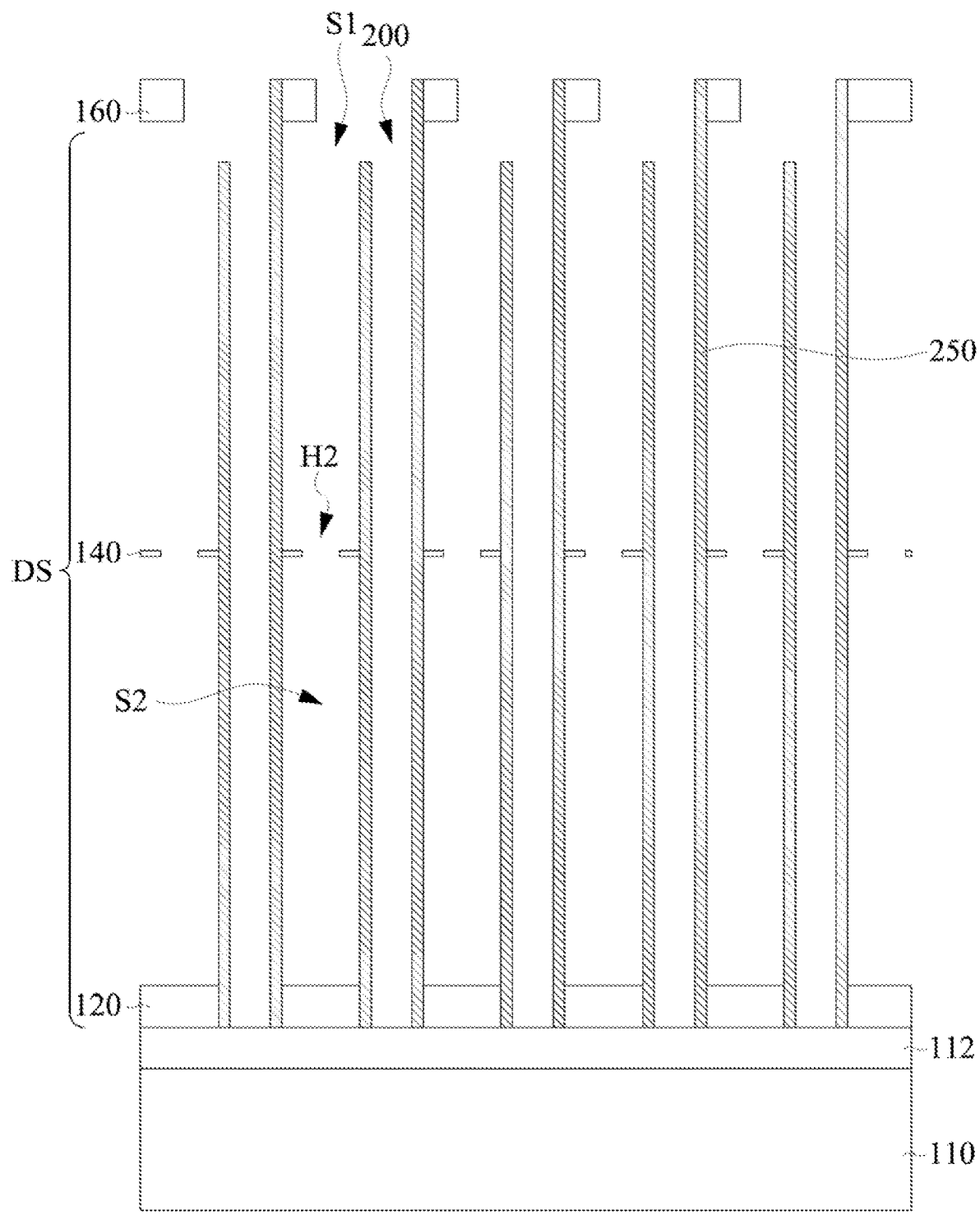

Referring to FIG. 11 and FIG. 12, the first sacrificial layer 130 of the dielectric stack DS is removed from the second hole H2. In some embodiments, an etching process is performed to remove the first sacrificial layer 130. For example, the first sacrificial layer 130 is removed by using a wet etching process, and an etch solution thereof includes fluoride-based solution, such as hydrogen fluoride (HF). After removing the first sacrificial layer 130, spaces S2 are formed between the second support layer 140 and the first support layer 120, and the spaces S1 and the spaces S2 are connected by the second hole H2 in the second support layer 140. The first support layer 120, the second support layer 140 and the third support layer 160 are connected by the bottom electrode layers 250.

Figure 13:
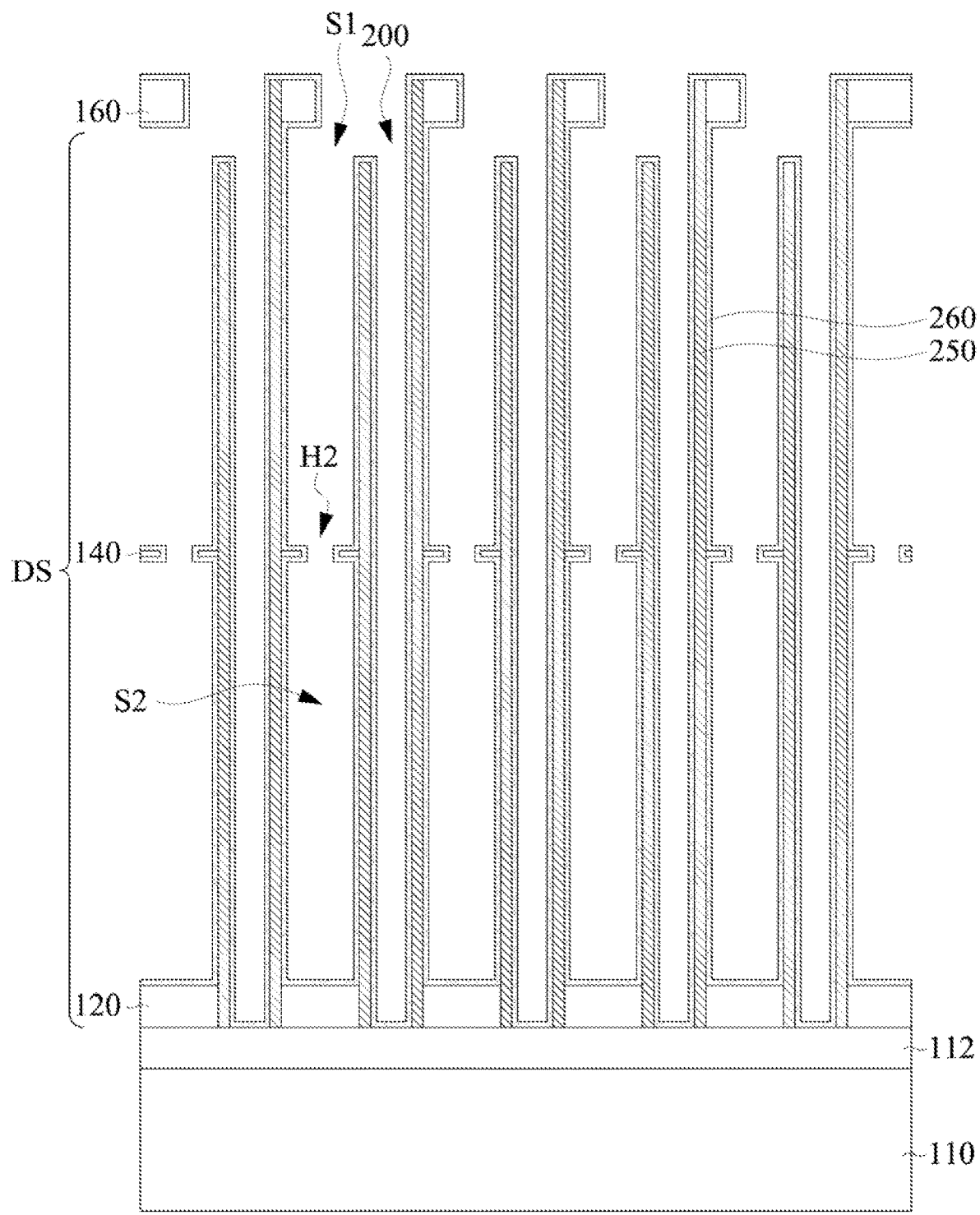

Referring to FIG. 13, high-k dielectric layers 260 are formed along sidewalls of the bottom electrode layers 250. The high-k dielectric layers 260 may be formed along the sidewalls of the bottom electrode layers 250 in the spaces S1 and the spaces S2. The high-k dielectric layers 260 may also be formed along the sidewalls of the bottom electrode layers 250 in the second openings 200 of the second dielectric stack DS. Further, the high-k dielectric layers 260 may be formed along the sidewalls, the top surfaces and the bottom surfaces of the second support layer 140 and the third support layer 160, and the top surface of the first support layer 120. In some embodiments, the high-k dielectric layers 260 are formed over and in contact with the metal line 112 of the substrate 110.

In some embodiments, the high-k dielectric layers 260 include hafnium oxide (HfO). In various examples, the high-k dielectric layers 260 include metal oxide (such as HfSiO$_2$, ZnO, ZrO$_2$, Ta$_2$O$_5$, Al$_2$O$_3$, or the like), metal nitride, or combinations thereof.

Figure 14:
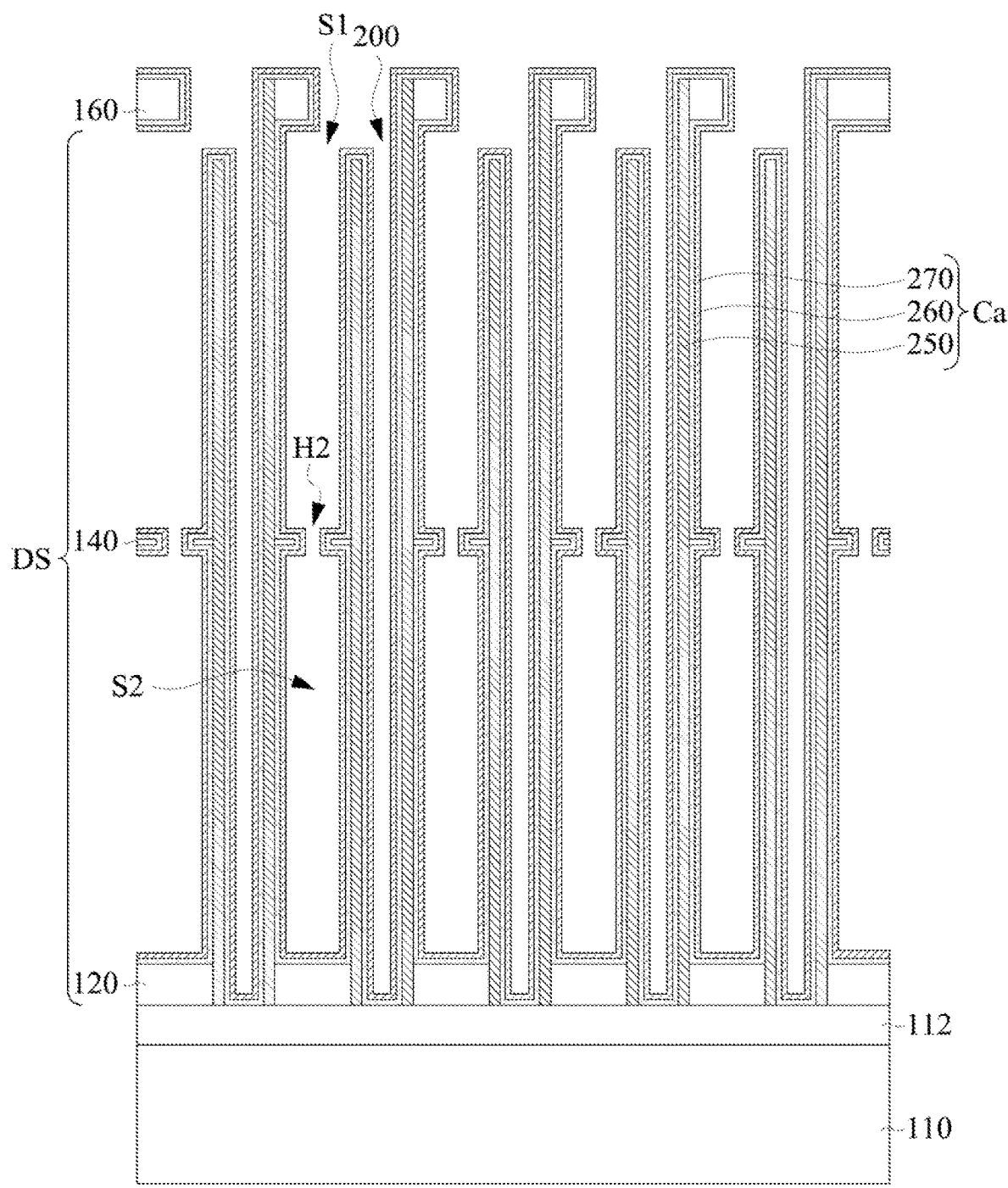

Referring to FIG. 14, top electrode layers 270 are formed along the high-k dielectric layers 260. The top electrode layers 270 may be formed along the sidewalls of the high-k dielectric layers 260 in the spaces S1 and the spaces S2. The top electrode layers 270 may also be formed along the sidewalls of the high-k dielectric layers 260 in the second openings 200 of the dielectric stack DS. In some embodiments, the top electrode layers 270 are over the horizontal surface of the high-k dielectric layers 260. The top electrode layers 270 may include titanium nitride (TiN), or other suitable conductive materials. In some embodiments, the top electrode layers 270 and the bottom electrode layers 250 include the same materials.

Figure 15:
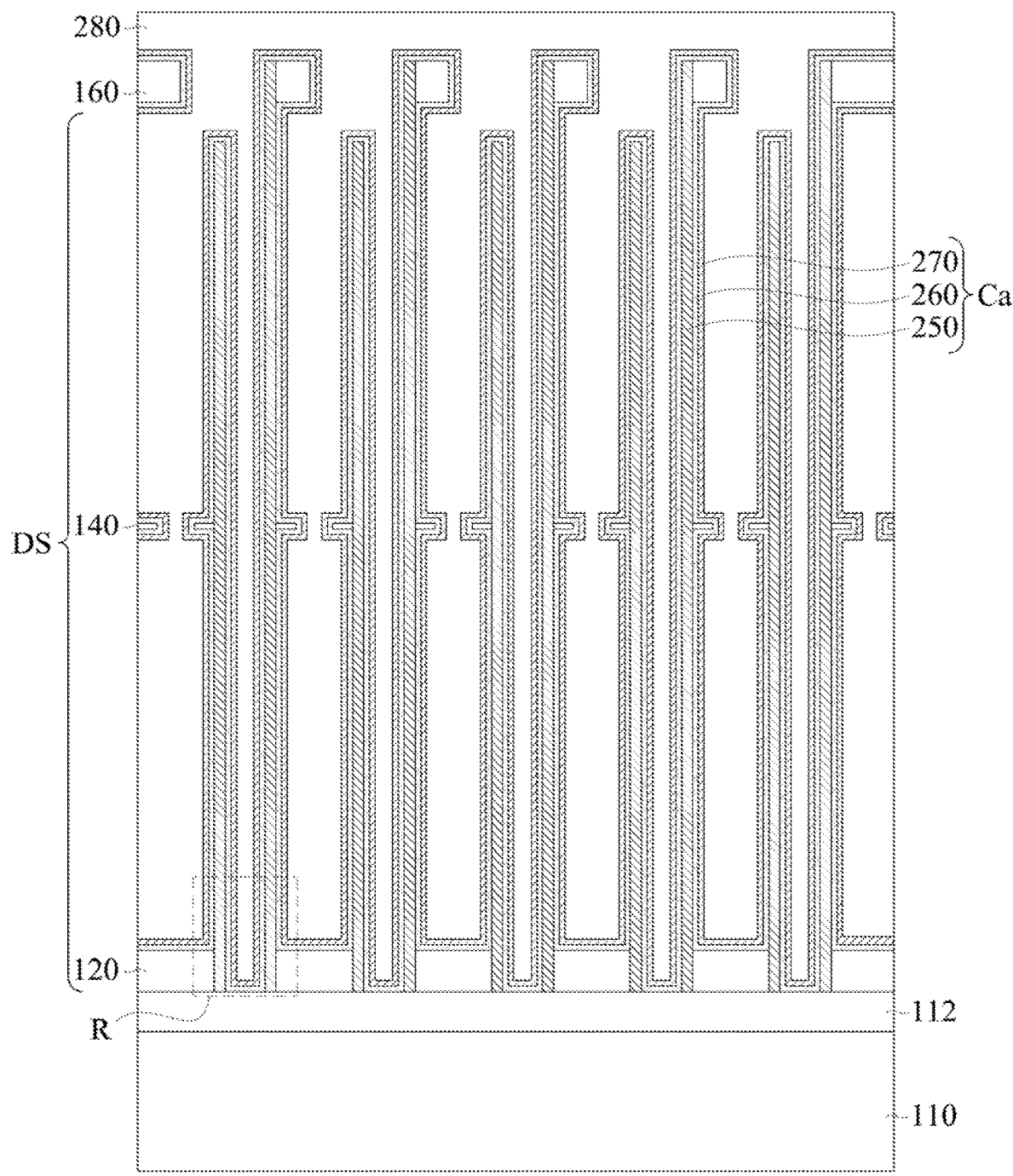

Referring to FIG. 14 and FIG. 15, semiconductor layers 280 are formed in the spaces S1 between the first support layer 120 and the second support layer 140, the spaces S2 between the second support layer 140 and the third support layer 160, and the second hole H2 in the second support layer 140. The semiconductor layers 280 may entirely fill the spaces S1, the spaces S2 and the second openings 200 of the dielectric stack DS. The semiconductor layers 280 may also be in contact and cover the top electrode layers 270 over the third support layer 160. As such, the capacitors Ca are formed in the second openings 200 and in the spaces S1 and the spaces S2. Since the second openings 200 are not excessively expanded during former etching processes, a profile of the capacitor Ca is not adversely affected and the structure of the capacitor Ca can be stable (e.g., prevent short circuits in the capacitor Ca).

In some embodiments, a semiconductor structure includes a plurality of support layers (i.e., the first support layer 120, the second support layer 140 and the third support layer 160) and the capacitors Ca. The first support layer 120, the second support layer 140 and the third support layer 160 are arranged from bottom to top, and the first support layer 120, the second support layer 140 and the third support layer 160 are spaced apart from each other. In other words, the third support layer 160 is above the second support layer 140, and the second support layer 140 is above the first support layer 120. In some embodiments, a width of the second support layer 140 is less than a width of the third support layer 160 or a width of the first support layer 120. Each of the capacitors Ca includes the bottom electrode layer 250, the high-k dielectric layers 260 and the top electrode layers 270. It is noted that the capacitors Ca in FIG. 15 are illustrative, and the capacitors Ca are not limited to the configuration illustrated in FIG. 15. For example, additional layers are included in the capacitors Ca.

Figure 16:
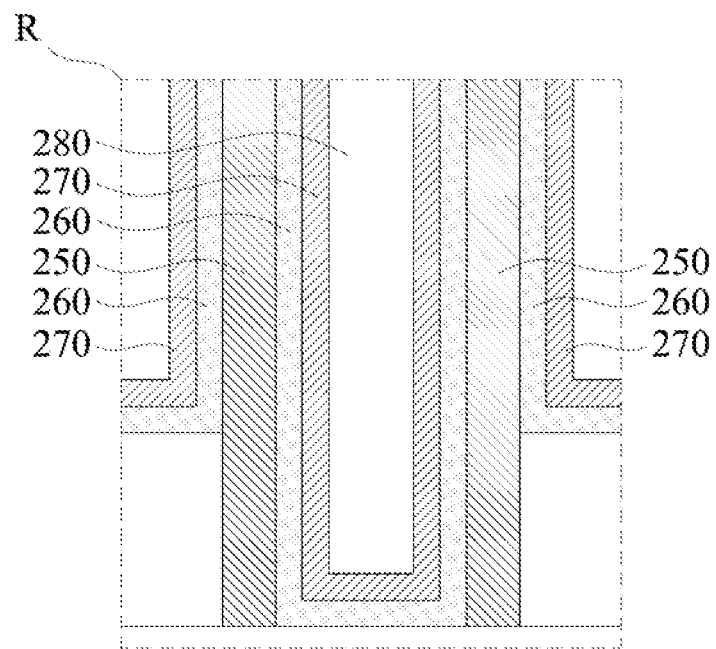
FIG. 16 shows a partially enlarged view of FIG. 15.
Figure 17:
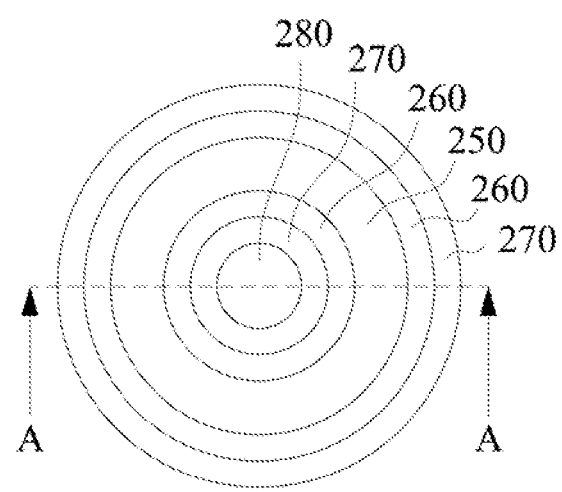
FIG. 17 is a top view of FIG. 16.

FIG. 16 shows a partially enlarged view of a region R in FIG. 15, and FIG. 17 is a top view of FIG. 16. The region R shows the capacitor Ca of the semiconductor structure in FIG. 15. In some embodiments, a cross-section of the region R in FIG. 16 is taken along line A-A in FIG. 17. As shown in FIG. 17, the semiconductor layer 280 is surrounded by the top electrode layer 270, the top electrode layer 270 is surrounded by the high-k dielectric layer 260, and the high-k dielectric layer 260 is surrounded by the bottom electrode layer 250. That is, the semiconductor layer 280 is positioned at a center, the top electrode layer 270 is arranged along and concentric relative to the semiconductor layer 280, the high-k dielectric layer 260 is arranged along and concentric relative to the top electrode layer 270, and the bottom electrode layer 250 is arranged along and concentric relative to the high-k dielectric layer 260. The semiconductor layer 280 has a round profile. Each of the bottom electrode layer 250, the high-k dielectric layer 260 and the top electrode layer 270 has a rounded ring profile.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming semiconductor structure, comprising:
   forming a dielectric stack over a substrate;
   forming a mask layer over the dielectric stack;
   forming a first opening in the mask layer to expose dielectric stack;
   forming a second opening in the dielectric stack to expose the substrate, wherein the second opening is communicated with the first opening;
   filling a fill layer in the first opening of the mask layer and the second opening of the dielectric stack such that the fill layer is in contact with the mask layer and the substrate;
   removing the mask layer and the fill layer such that sidewalls of the dielectric stack are exposed; and
   forming a capacitor in the second opening of the dielectric stack.

2. The method of claim 1, wherein the mask layer and the fill layer comprise the same materials.

3. The method of claim 1, wherein removing the mask layer and the fill layer is performed simultaneously by using one etching process.

4. The method of claim 1, further comprising:
   performing a clean process prior to removing the mask layer and the fill layer.

5. The method of claim 1, wherein forming the dielectric stack comprises:
   forming a first sacrificial layer over the substrate; and
   forming a second sacrificial layer over the first sacrificial layer.

6. The method of claim 5, wherein filling the fill layer is performed such that the fill layer covers sidewalls of the first sacrificial layer and the second sacrificial layer.

7. The method of claim 5, wherein forming the dielectric stack further comprises:
   forming a first support layer over the substrate;
   forming a second support layer over the first sacrificial layer; and
   forming a third support layer over the second sacrificial layer.

8. The method of claim 7, wherein forming the capacitor in the second opening of the dielectric stack comprises:
   forming a bottom electrode layer along the sidewalls of the dielectric stack;
   removing a portion of the third support layer to form a first hole exposing the second sacrificial layer;
   removing the second sacrificial layer from the first hole;
   forming a high-k dielectric layer along a sidewall of the bottom electrode layer; and
   forming a top electrode layer along a sidewall of the high-k dielectric layer.

9. The method of claim 8, further comprising:
   forming a semiconductor layer between the first support layer and the second support layer, and between the second support layer and the third support layer.

10. The method of claim 8, wherein forming the capacitor in the second opening of the dielectric stack further comprises:
    removing a portion of the second support layer to form a second hole exposing the first sacrificial layer; and
    removing the first sacrificial layer from the second hole prior to forming the high-k dielectric layer.

11. The method of claim 10, wherein forming the capacitor in the second opening of the dielectric stack further comprises:
    removing a horizontal portion of the bottom electrode layer to expose the substrate prior to removing the first sacrificial layer.

12. A method of forming semiconductor structure, comprising:
    forming a dielectric stack over a substrate, wherein forming the dielectric stack comprises forming a first support layer, a first sacrificial layer, a second support layer, a second sacrificial layer and a third support layer in sequence;
    forming a mask layer over the dielectric stack;
    forming a first opening in the mask layer to expose the third support layer of the dielectric stack;
    forming a second opening in the dielectric stack to expose the substrate, wherein the second opening is communicated with the first opening;
    filling a fill layer in the first opening of the mask layer and the second opening of the dielectric stack such that the fill layer is in contact with the mask layer and the substrate, and a native oxide layer is formed over top surfaces of the fill layer and the mask layer;
    performing a clean process to remove the native oxide layer;
    performing an etching process to remove the mask layer and the fill layer; and
    forming a capacitor in the second opening of the dielectric stack.

13. The method of claim 12, wherein the etching process is a wet etching process.

14. The method of claim 12, wherein the clean process and the etching process are performed by using different etch solutions.

15. The method of claim 14, wherein the clean process is performed by using an acid etch solution and the etching process is performed by using an alkaline etch solution.

16. The method of claim 12, wherein the first sacrificial layer and the second sacrificial layer remain unchanged while performing the clean process.

17. The method of claim 12, wherein filling the fill layer is performed such that the fill layer is surrounded by the first support layer, the first sacrificial layer, the second support layer, the second sacrificial layer and the third support layer.

18. The method of claim 12, wherein filling the fill layer is performed such that the fill layer extends from the substrate to the mask layer.

19. The method of claim 12, wherein the mask layer and the fill layer are polysilicon layers.

* * * * *